United States Patent [19]
Schwalke

[11] Patent Number: 5,882,964
[45] Date of Patent: Mar. 16, 1999

[54] PROCESS FOR THE PRODUCTION OF AN INTEGRATED CMOS CIRCUIT

[75] Inventor: Udo Schwalke, Heldenstein, Germany

[73] Assignee: Siemens Aktiengesellschaft, Munich, Germany

[21] Appl. No.: 719,411

[22] Filed: Sep. 24, 1996

[30] Foreign Application Priority Data

Sep. 25, 1995 [DE] Germany .................. 195 35 629.2

[51] Int. Cl.$^6$ ............................................. H01L 21/8238

[52] U.S. Cl. ..................... 438/227; 438/229; 438/232; 438/291; 438/296; 438/297; 438/301

[58] Field of Search .................................. 438/221, 223, 438/225, 227, 229, 232, 289, 291, 296, 297, 299, 301, 216, 217, 356

[56] References Cited

U.S. PATENT DOCUMENTS

| Re. 34,158 | 1/1993 | Watanabe . | |
|---|---|---|---|
| 4,847,213 | 7/1989 | Pfiester . | |
| 5,407,840 | 4/1995 | Manoliu et al. ........................... | 437/31 |
| 5,438,214 | 8/1995 | Egawa et al. . | |

FOREIGN PATENT DOCUMENTS

| 0 660 394 A1 | 6/1995 | European Pat. Off. . |
|---|---|---|
| 41 10 645 A1 | 10/1991 | Germany . |

OTHER PUBLICATIONS

International Journal of High Speed Electronics and Systems, vol. 5, No. 2, 1994, pp. 135–143, D. Yu et al.

International Journal of High Speed Electronics and Systems, vol. 5, No. 2 (1994), World Scientific Publishing Company, D.C.H. Yu et al, New Robust $n^+/p^+$ Dual–Gate CMOS Technology Optimized for Low Power Operation, pp. 135–143.

IEDM (1988), IBM Research Division, T.J. Watson Research Center, Yorktown Hts., N.Y., Doping of $N^{30}$ And $P^+$ Polysilicon in a Dual–Gate CMOS Process, C.Y. Wong et al, pp. 238–241.

IEDM (1985), (Invited Paper), Motorola, Inc., Austin, TX., Process and Device Considerations for Micron and Submicron CMOS Technology, L.C. Parrillo, pp. 398–402.

*Primary Examiner*—Michael Trinh
*Assistant Examiner*—Long Pham
*Attorney, Agent, or Firm*—Hill & Simpson

[57] ABSTRACT

In order to produce an integrated CMOS circuit, a dielectric layer and a silicon layer are applied to a substrate. During the formation of insulation structurers which insulate neighboring active regions in the substrate, the silicon layer is structured in such a way that it has separate sub-regions which are subsequently doped differently. By full-surface deposition of an electrically conductive layer and common structuring of the electrically conductive layer and the structured silicon layer differently doped gate electrodes and a metallization plane, by which the gate electrodes are electrically connected, are formed. Division of the silicon layer before doping prevents lateral dopant diffusion.

20 Claims, 14 Drawing Sheets

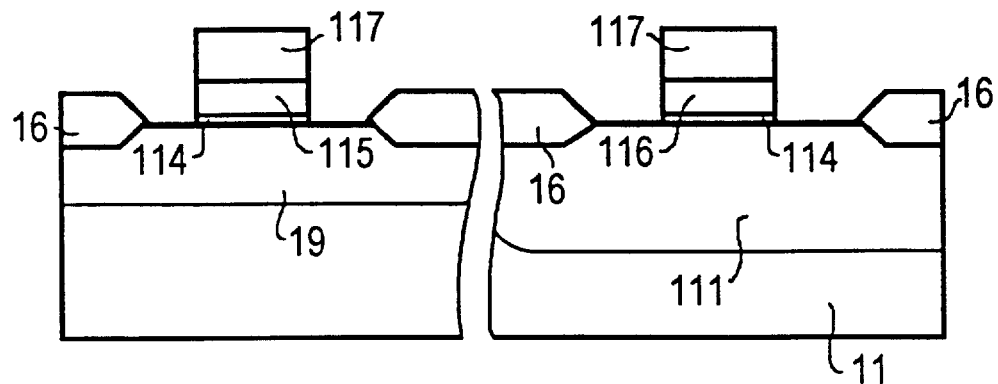
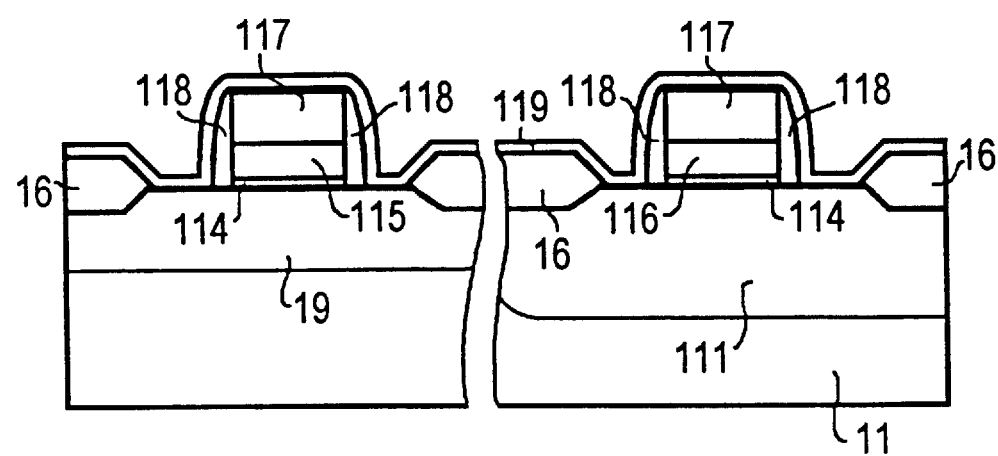

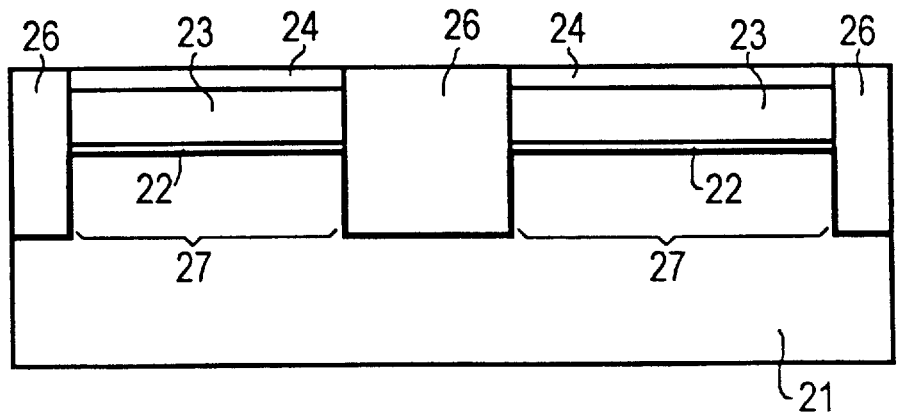
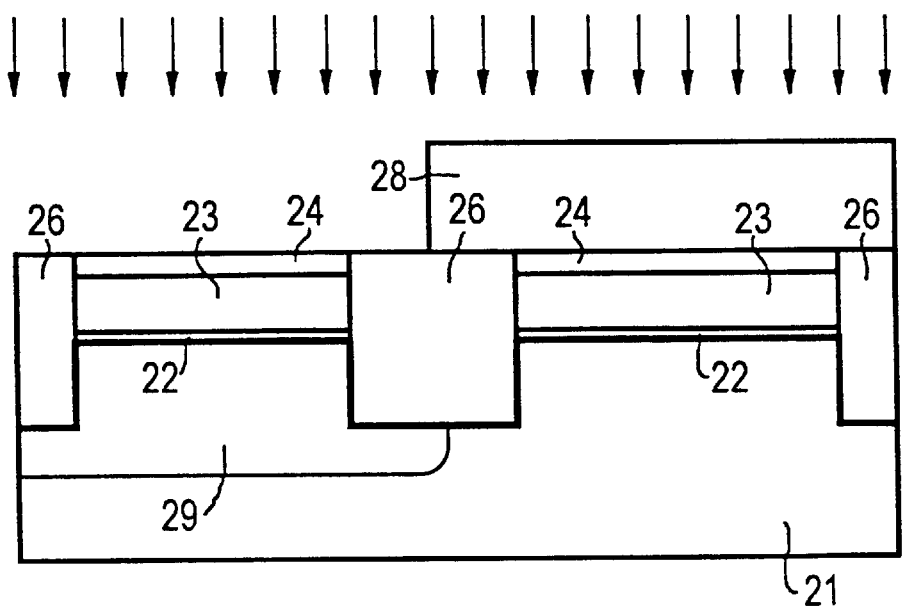

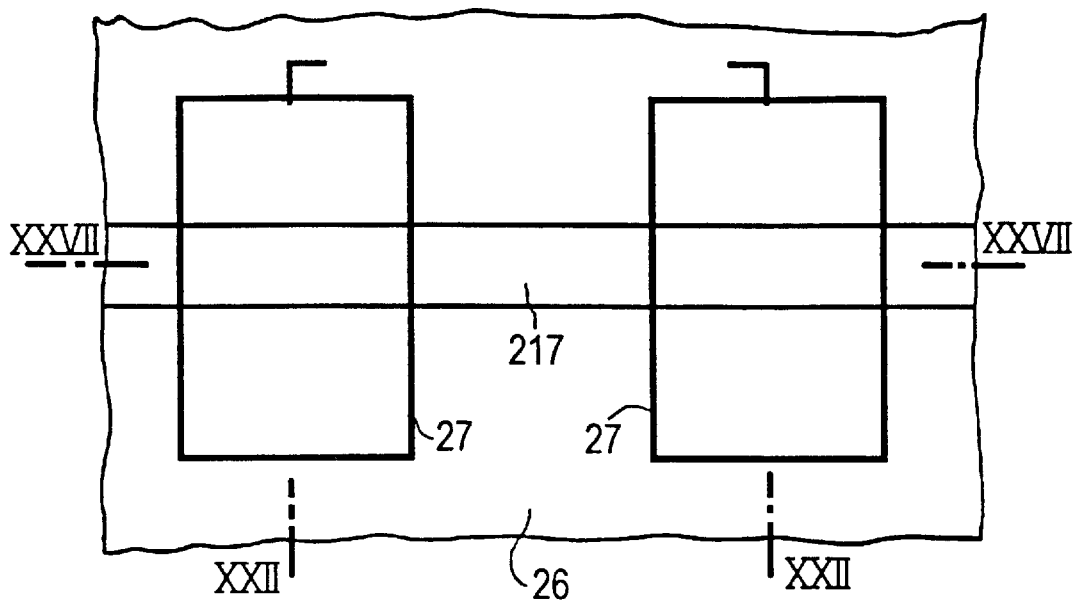
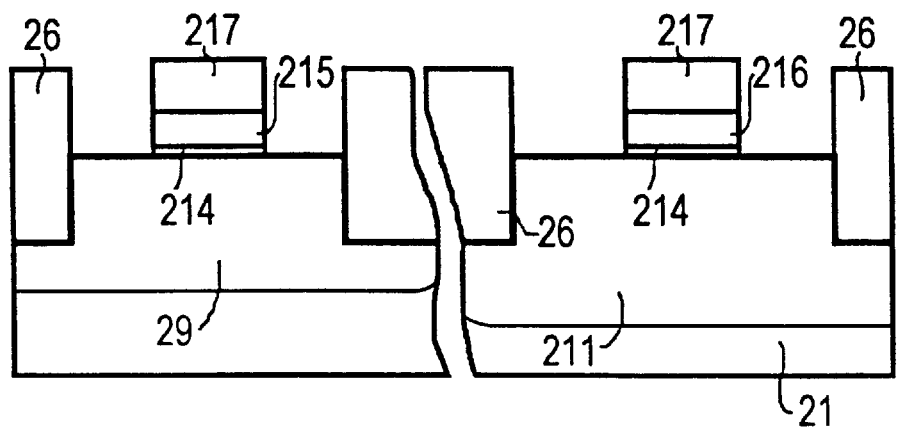

PROCESS FOR THE PRODUCTION OF AN INTEGRATED CMOS CIRCUIT

BACKGROUND OF THE INVENTION

In CMOS logic circuits, for example in inverters, use is made of both n-channel MOS transistors and p-channel MOS transistors. In this case, electrical connections between the gate electrodes of p-channel MOS transistors and n-channel MOS transistors are often made in a gate plane which is formed by structuring a layer and which, in addition to the gate electrodes, has connection elements between the gate electrodes. The gate electrodes and the connection elements between the gate electrodes are often produced as a continuous gate line. In CMOS circuits which are operated with a supply voltage of 5 volts, the gate plane is usually made of $n^+$-doped polysilicon or polycide.

In CMOS circuits for low-voltage/low-power applications, which are operated with a supply voltage of <3 volts, the MOS transistors are optimized in such a way that they have threshold voltages $|V_{th}|$<0.4 volt and at the same time low leakage currents. The gate lengths of these MOS transistors are less than 0.25 $\mu$m. The concomitant high requirements on the short-channel behavior of the MOS transistors are satisfied by using a dual work-function gate technology with optimized gate work function. The term "dual work-function gate technology" means the fact that the gate electrodes for the n-channel MOS transistors and for the p-channel MOS transistors are doped differently. In the case of a gate plane with a continuous gate line which connects the various gate electrodes, this different doping in the gate electrodes leads to the danger of lateral dopant diffusion (see, for example, L. C. Parillo, IEDM 85, P 398).

The electrical properties, for example the threshold voltage $V_{th}$, of the MOS transistors depends essentially on the gate doping. Lateral dopant diffusion leads to a change in the gate doping, and therefore to undesired, uncontrollable parameter shifts. In the extreme case, this can lead to reverse doping of $n^+$-doped or $p^+$-doped gate electrodes, and therefore to complete failure of the components. Furthermore, in the connection between $n^+$-doped gate electrodes and $p^+$-doped gate electrodes, with regard to a low bulk resistance, $n^+$-doped regions and $p^+$-doped regions must be directly adjacent, since a space-charge region would otherwise form.

To suppress lateral dopant diffusion in dual work-function gate technology, it has been proposed (see, for example, D. C. H. Yu et al. Int. J. High Speed Electronics and Systems, Vol. 5, p 135, 1994) not to use a continuous polysilicon connection in the gate plane between differently doped gate electrodes. Instead of this, the polysilicon gate line is divided and is electrically conductively connected via a metal bridge, for example of aluminum. Contact between the metal bridge and the gate-line segments is then made via contact holes opened in an interposed insulation layer. As an alternative, a suitable metallic conductor, for example TiN, W, $Wsi_2$, is deposited and structured after division of the gate line. These solutions are expensive processes and to some extent require additional spatial requirements for making contact and metallization.

It has furthermore been proposed (see C. Y. Wong et al., IEDM 88, p 238) to minimize the lateral dopant diffusion in dual work-function gate technology by a reduction in the thermal loading. However, this leads to a narrow process window, for example, for the dopant activation in the gate electrode and for the planarization reflow. Furthermore, this proposed solution has not yet lead to satisfactory results.

SUMMARY OF THE INVENTION

The object of the invention is to provide an improved process for the production of an integrated CMOS circuit, in which the gate electrodes of the complementary MOS transistors are doped differently, in which lateral dopant diffusion is suppressed and which can be carried out with less process expenditure than with known solutions.

In the process according to the invention, a dielectric layer and a silicon layer are applied to a substrate, which is preferably a monocrystalline silicon wafer. During the production process, the gate dielectric of the MOS transistors is formed from the dielectric layer, and the gate electrodes of the MOS transistors are formed from the silicon layer.

Insulation structures, which insulate neighboring transistors in the substrate, are produced at the main face of the substrate. During formation of the insulation structures, the silicon layer is structured in such a way that the structured silicon layer comprises a plurality of sub-regions. These sub-regions are each separated from one another by the insulation structures. The structuring of the silicon layer can be carried out either by local removal of parts of the silicon layer, for example by etching, or by local conversion of parts of the silicon layer into another material, in particular $SiO_2$. This structuring is carried out during the formation of the insulation structure, that is to say no additional mask is required for structuring the silicon layer.

In regions for first MOS transistors with a channel of a first conductivity type, the structured silicon layer is doped differently than in regions for second MOS transistors with a channel of a second conductivity type, opposite to the first. The doping in the regions for the first MOS transistors differs from the doping in regions for the second MOS transistors by the conductivity type and/or the dopant concentration.

An electrically conductive layer is deposited and is structured together with the structured silicon layer. Structuring is carried out by using a common mask. In this case, gate electrodes for the first MOS transistors and for the second MOS transistors are formed from the structured silicon layer, and a metallization plane is formed from the electrically conductive layer. The metallization plane has gate lines which connect together differently doped gate electrodes.

Since the different doping for the various gate electrodes is not produced until after the silicon layer has been structured, a change in the doping of the different gate electrodes by lateral diffusion in the silicon layer is not possible. Since the silicon layer is structured during formation of the insulation structures, and the insulation structures each enclose a region for a transistor, the sub-regions of the structured silicon layer are each arranged above a region for a transistor and are enclosed by the corresponding insulation structures. Division of the silicon layer is thus effected without an additional mask. Structuring of the gate electrodes takes place subsequently, together with structuring of the electrically conductive layer to form the metallization plane. Since the silicon layer has been structured before the doping, in such a way that it has a plurality of mutually separated sub-regions, the electrically conductive layer extends partly on the surface of the silicon layer and partly on the surface of the insulation structure. By means of the electrically conductive layer, connection between separate sub-regions of the structured silicon layer can thus be produced without additional process steps for making contact between the gate electrodes and the metallization plane being necessary.

It is within the scope of the invention that the structured silicon layer is doped in regions in which the first MOS transistors are formed, while the structured silicon layer is covered with a first mask in regions in which the second MOS transistors are formed. Subsequently, the structured silicon layer is doped in regions for the second MOS transistors while the structured silicon layer is covered with a second mask in regions for the first MOS transistors.

It is within the scope of the invention that implantation for forming wells doped with the second conductivity type, and channel implantation for the first MOS transistors, take place before the structured silicon layer is doped in regions for the first MOS transistors, by using the first mask. Correspondingly, implantation for forming wells doped with the first conductivity type, and channel implantation for the second MOS transistors, take place before the structured silicon layer is doped in regions for the second MOS transistors, by using the second mask. These implantations are carried out with an energy such that the dopants are propelled through the structured layer and the dielectric layer and into the substrate. In order to heal the implantation damage in the dielectric layer, a heat treatment at high temperature may be included in the process sequence, since there is no lateral diffusion between differently doped gate electrodes.

Preferably, a heat-treatment step for activating the dopants is carried out before the electrically conductive layer is deposited. The healing of the implantation damage in the dielectric layer optionally also takes place during this heat-treatment step. Activating the dopants before the deposition of the electrically conductive layer has the advantage that such materials through which slight diffusion of dopants is possible are also suitable as the electrically conductive layer.

The insulation structures may be formed either in a LOCOS process or in a shallow-trench insulation process. In a LOCOS process, a cover layer of a non-oxidizable material is formed and is structured using an insulation mask which defines the arrangement of the insulation structures. The insulation structures are subsequently formed by local thermal oxidation. The structured cover layer then acts as an oxidation mask. During the local thermal oxidation, that part of the silicon layer not covered by the structured cover layer is oxidized through its bulk to form the insulation structures. This produces sub-regions of the structured silicon layer which are each separated form one another by the insulation structures.

The LOCOS process can also be carried out in such a way that both the cover layer and the silicon layer are etched with the aid of the insulation mask. The local thermal oxidation for forming the insulation structures then takes place at the surface of the substrate.

As an alternative, the insulation structures are formed as trenches filled with insulating material. To this end, in a shallow-trench insulation process, trenches are etched into the substrate using an etching mask and are filled with insulating material.

For applications which place only little demand on the insulation structures, for example for low-voltage/low-power applications, it is sufficient if the trenches, which are filled with insulating material, extend only as far as the surface of the substrate. In this case, in a modified shallow-trench insulation process, the trenches are etched only as far as the surface of the substrate and are filled with insulating material.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 9 shows the section, denoted IX—IX in FIG. 8, through the substrate after formation of the gate plane.

FIG. 10 shows the section represented in FIG. 9, after formation of spacers on the flanks of the gate electrodes.

FIG. 17 shows the section through the substrate after trench etching, in which the cover layer, the silicon layer and the dielectric layer are structured and in which trenches are formed in the substrate and are filled with insulating material.

FIG. 18 shows the section through the substrate during the doping of the structured silicon layer in regions for first MOS transistors.

FIG. 21 shows a view on the substrate after the gate structuring.

FIG. 22 shows the section, denoted XXII—XXII in FIG. 21, through the substrate after the gate structuring.

DESCRIPTION OF THE PREFERRED EMBODIMENTS

Figure 1:
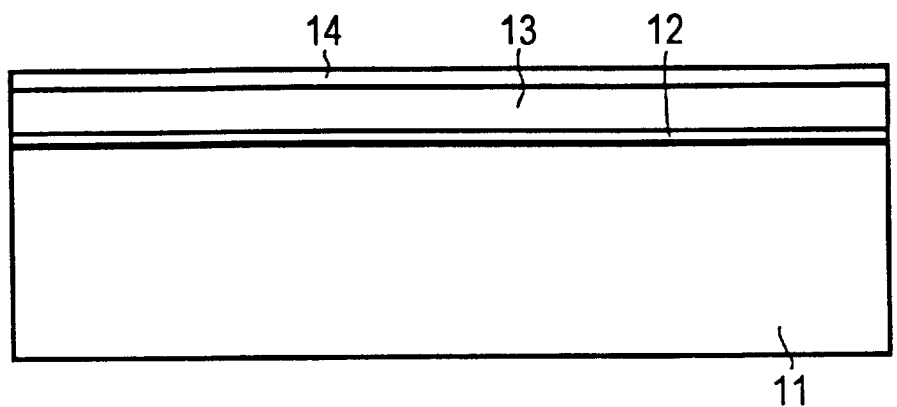
FIG. 1 shows a substrate with a dielectric layer, a silicon layer and a cover layer.

A dielectric layer 12, a silicon layer 13 and a cover layer 14 are applied to a substrate 11 (see FIG. 1). The substrate 11 consists, for example, of a monocrystalline silicon wafer. Later in the process, the dielectric layer 12 is used both as a pad oxide for a LOCOS process and as the gate dielectric. The dielectric layer 12 is formed, for example, from $SiO_2$ by thermal oxidation to a thickness of 3 to 20 nm. The silicon layer, from which the gate electrodes are formed later in the process and which is used as, a buffer layer in a poly-buffered LOCOS process, is deposited using polycrystalline or amorphous silicon to a layer thickness of 50 to 200 nm. The cover layer 4 is formed from non-oxidizable material, for example $Si_3N_4$. The cover layer 14 is formed, for example, by CVD to a thickness of 20 to 50 nm.

Figure 2:
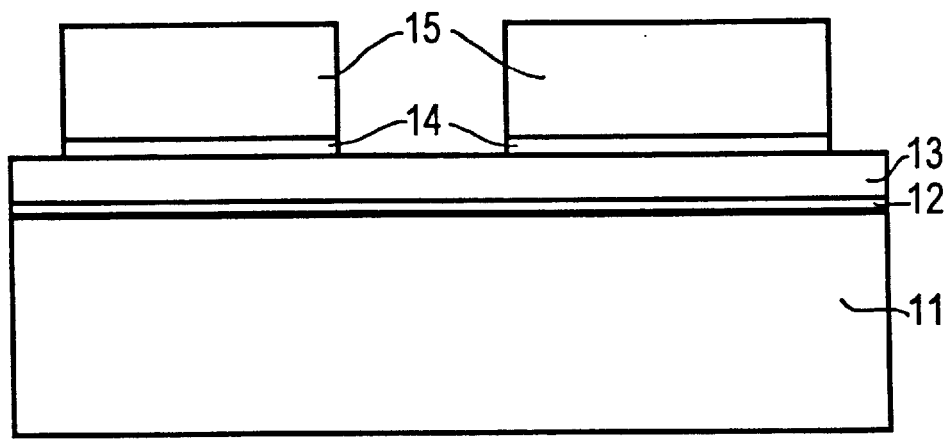
FIG. 2 shows the substrate after structuring of the cover layer.

A photoresist insulation mask 15 is formed using photolithographic process steps (see FIG. 2). The insulation mask defines the arrangement of insulation structures to be produced later. In an anisotropic dry etching process, for example with $CHF_3/O_2$, the cover layer 14 is structured in accordance with the insulation mask 15 (see FIG. 2).

Figure 3:
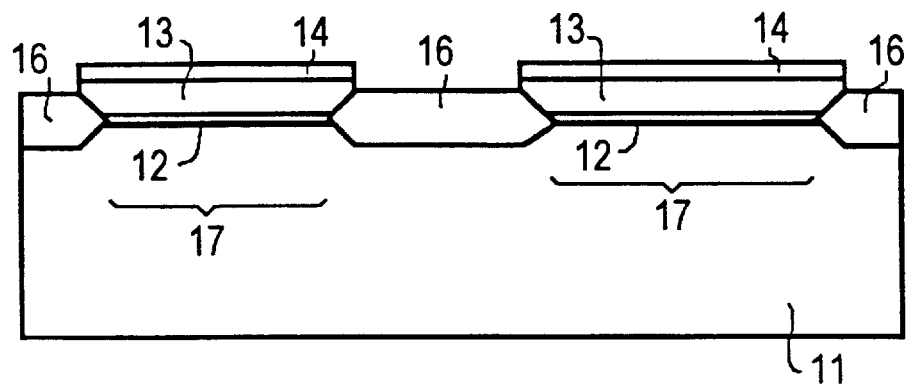
FIG. 3 shows the substrate after formation of insulation structures in a poly-buffered LOCOS process, in which the silicon layer is structured.
Figure 4:
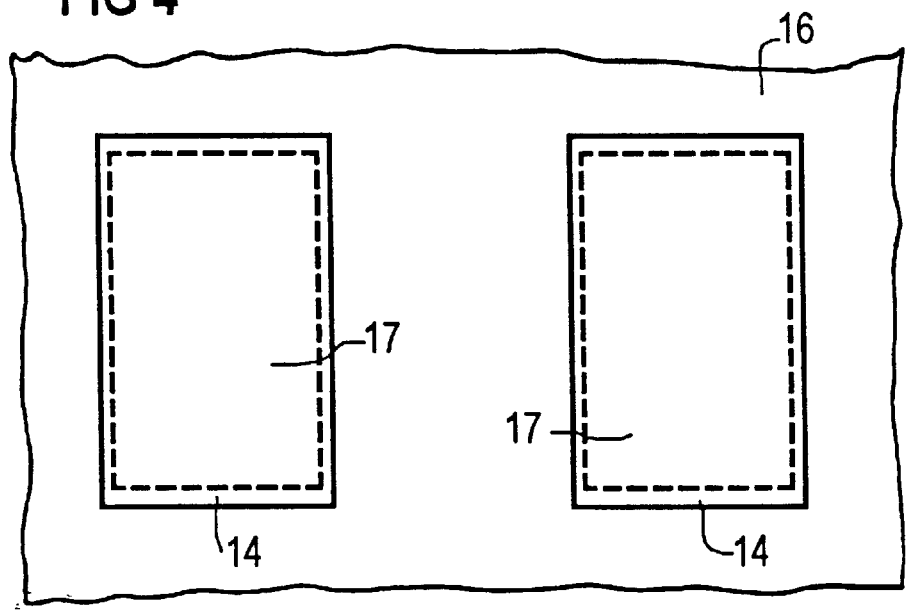
FIG. 4 shows a view on the structure represented in FIG. 3.

After the insulation mask 15 has been removed, insulation structures 16 are formed in a poly-buffered LOCOS process. The dielectric layer 12, the silicon layer 13 and the cover layer 14 then act as a LOCOS hard mask. In the poly-buffered LOCOS process, the silicon layer 13 is structured by oxidization on the parts of the silicon layer 13 which are not covered by the cover layer 14. This produces the structured silicon layer 13 with sub-regions which are each separated from one another by the insulation structures 16 (see FIG. 3). The insulation structures 16 each annularly enclose active regions 17 for MOS transistors (see FIG. 4). The sub-regions of the structured silicon layer 13 each extend through the active regions 17 and as far as the insulation structures 16. They are, however, fully separated from one another. In the view in FIG. 4, the size and position of the active regions 17 have been indicated as discontinuous contours.

Figure 5:
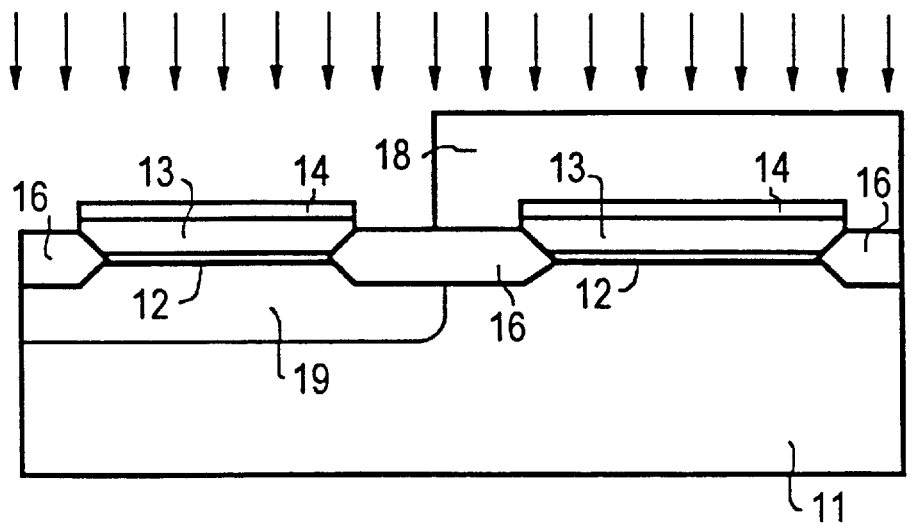
FIG. 5 shows a section through the substrate during the doping of the structured silicon layer in regions for first MOS transistors.

A first mask 18, which covers the active regions 17 for n-channel MOS transistors, is produced from photoresist using photolithographic process steps (see FIG. 5). By implantation with, for example, phosphorus at an energy of 500 keV and a dose of $1\times10^{13}$ at/$cm^2$, an n-doped well 19 is formed in each of the active regions 17 for the p-channel MOS transistors.

Channel implantation for the p-channel MOS transistors is then carried out with phosphorus at an energy of 220 keV and a dose of $3\times10^{12}$ at/$cm^2$. The implantation of the n-doped well 19 and the channel implantation are carried out with an energy which is high enough for the dopants to be propelled through the cover layer 14, the silicon layer 13 and the dielectric layer 12, but not necessarily through the insulation structures 16 in the case of the channel implantation.

$P^+$ implantation with boron at an energy of, for example, 20 keV and a does of, for example, $3\times10^{15}$ at/$cm^2$ is then carried out. This makes the silicon layer 13 $p^+$-doped in the regions for p-channel MOS transistors. During this implantation, the energy is set in such a way that the dopants are propelled exactly into the silicon layer 13.

Figure 6:
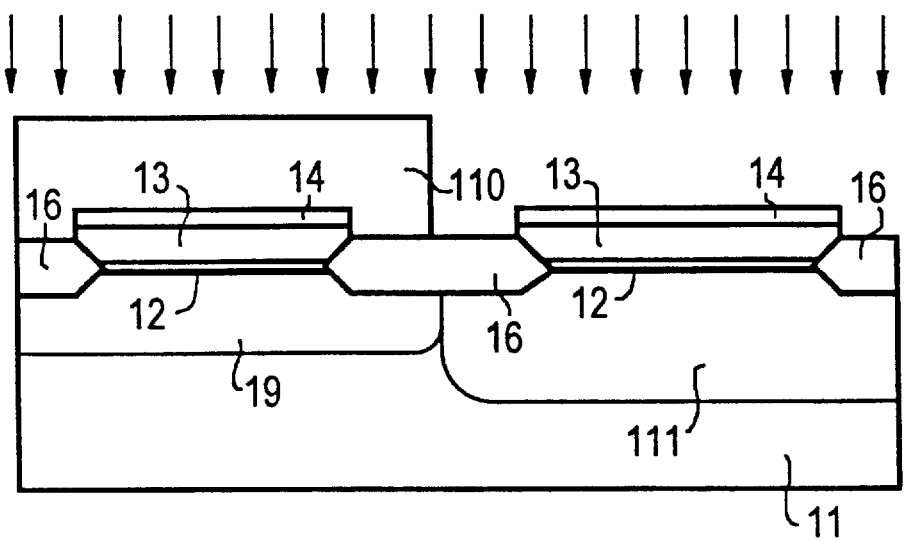
FIG. 6 shows a section through the substrate during the doping of the silicon layer in regions for second MOS transistors.

The first mask 18 is then removed. A second mask 110, which covers the active regions of the p-channel MOS transistors, is produced using photolithographic process steps (see FIG. 6). p-doped wells 111 are formed in active regions for n-channel MOS transistors by implantation with boron at an energy of 250 keV and a dose of $1\times10^{13}$ at/$cm^2$. Channel implantation with boron is then carried out at an energy of 100 keV and a dose of $3\times10^{12}$ at/$cm^2$. During these implantations, the energy is selected in such a way that the boron ions are propelled through the cover layer 14, the silicon layer 13, the dielectric layer 12, but not necessarily through the insulation structures 16 into the substrate 11 in the case of the channel implantation. The silicon layer 13 is $n^+$-doped in the zone for the n-channel MOS transistors by implantation with arsenic at an energy of 100 keV and a dose of $5\times10^{15}$ at/$cm^2$. During this implantation, the energy is selected in such a way that the ions are propelled directly into the silicon layer 13.

After the second mask 110 has been removed, a heat-treatment step is carried out, for example at 900° C., which activates the implanted dopants. Defects in the dielectric layer 12, which have been created in the well or channel implantation, are simultaneously healed in this heat-treatment step.

The cover layer 14 is then removed. An electrically conductive layer 112 is deposited over the entire surface. A metallization plane is formed from the electrically conductive layer 112 in the following part of the process. The electrically conductive layer is therefore preferably formed from a material having a resistivity of at most 500 $\mu\Omega$.cm. The electrically conductive layer 112 is, for example, formed from tungsten. As an alternative, the electrically conductive layer 112 may be formed from a different metal, a metal silicide, TiN or from a layer combination of metal and silicon, TiN and silicon or a thin dielectric ($SiO_2$, $Si_3 N_4$ and doped silicon. The electrically conductive layer 112 has a thickness of, for example, 200 nm.

Figure 7:
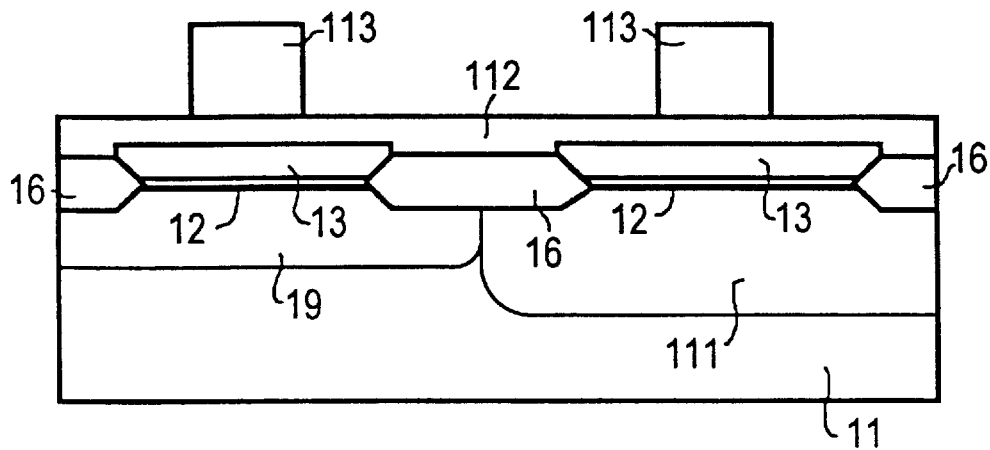
FIG. 7 shows a section through the substrate after deposition of an electrically conductive layer and formation of a mask for the gate structuring.
Figure 8:
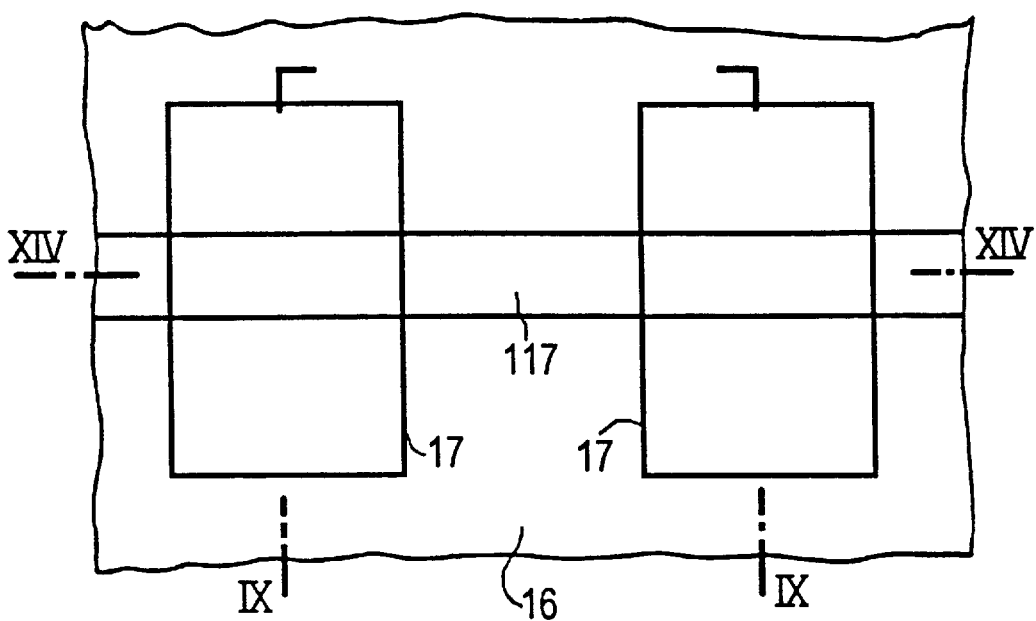
FIG. 8 shows a view on the substrate after structuring of the gate plane.

Using photolithographic process steps, a third mask 113 of photoresist is produced on the surface of the electrically conductive layer 112. The third mask 113 defines the position and size of gate electrodes for the p-channel MOS transistors and for the n-channel MOS transistors, as well as for a metallization plane (see FIG. 7). The electrically conductive layer 112, the silicon layer 13 and the dielectric layer 12 are structured by a two-stage anisotropic dry etching process, for example with $Cl_2$ and $HBr/Cl_2$. This forms a gate dielectric 114 from the dielectric layer 12. $p^+$-doped gate electrodes for the p-channel MOS transistors, and $n^+$-doped gate electrodes 116 for the n-channel MOS transistors are formed from the silicon layer 13. A metallization plane 117, which is arranged on the surface of the gate electrodes 115, 116 and which comprises gate lines between differently doped gate electrodes 115, 116, is formed from the electrically conductive layer 112 (see FIG. 8 and FIG. 9). The metallization plane 117 extends partly over the insulation structures 16 and thus connects differently doped gate electrodes 115, 116 which are created by structuring from differently doped sub-regions of the structured silicon layer 13. The metallization plane 117 in this case represents a connection, with very high electrical conductivity, which is impenetrable to lateral dopant diffusion between the differently doped gate electrodes 115, 116.

The surface of the substrate 11 in the active regions 17 is exposed laterally with respect to the gate electrodes 115, 116. Insulating spacers 118 are formed on the flanks of the gate electrodes 115, 116 and the metallization plane 117 by conformally depositing and anisotropically etching back an insulating layer. The insulating spacers 118 are, for example, formed from $SiO_2$, $Si_3N_4$, $SiO_2$ and polysilicon or $Si_3N_4$ and polysilicon (see FIG. 10). An insulating layer 119 of, for example $Si_3N_4$ or $SiO_2$ with a layer thickness of, for example, 10 nm is deposited over the entire surface, for example by CVD. The insulating layer 119 acts as an screen oxide for the subsequent implantations and prevents dopants from diffusing out during heat treatments.

Figure 11:
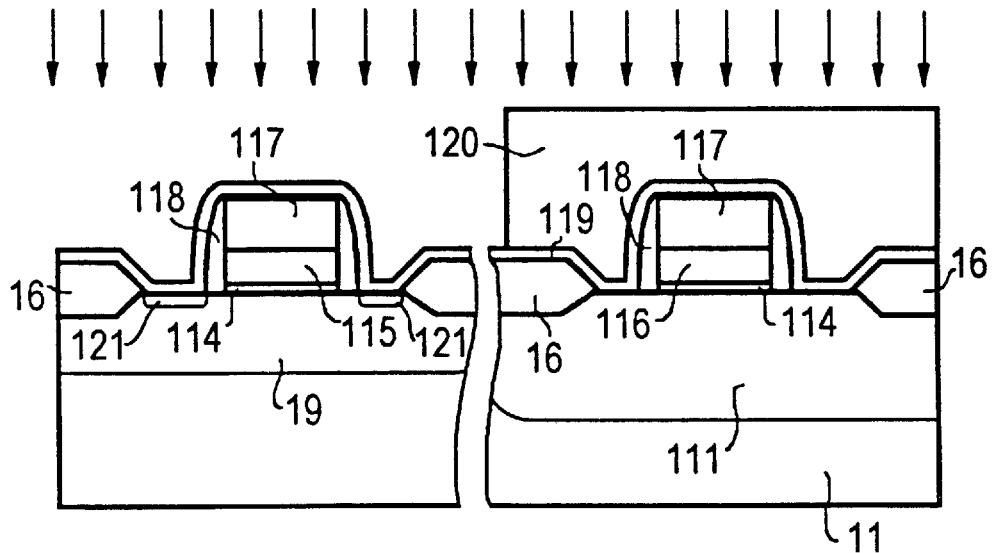
FIG. 11 shows the section, shown in FIG. 10, through the substrate during the source/drain implantation of the first MOS transistors.

A fourth mask 120, which covers the active regions for the n-channel MOS transistors, is formed from photoresist using photolithographic process steps. p-doped implanted regions 121 are formed, with self alignment with respect to the $p^+$-doped gate electrode 115 and the insulation structures 116, by implantation with boron at an energy of 10 keV and a dose of $4\times10^{15}$ at/$cm^2$ (see FIG. 11).

Figure 12:
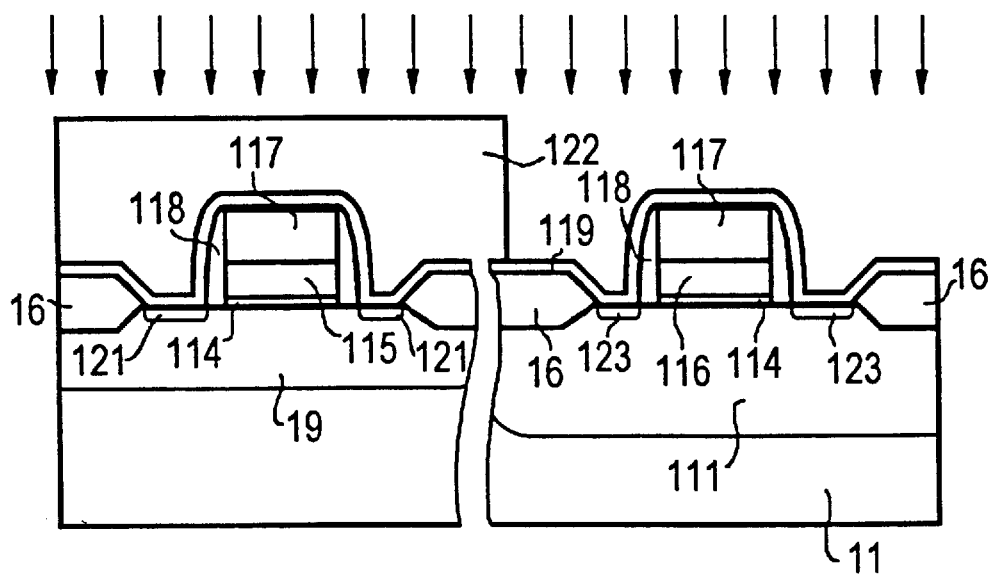
FIG. 12 shows the section, represented in FIG. 11, through the substrate during the source/drain implantation for the second MOS transistors.

After the fourth mask 120 has been removed, a fifth mask 122 of photoresist, which covers the p-channel MOS transistors, is formed using photolithographic process steps. n-doped implanted regions 123 are formed by implantation which arsenic at an energy of 60 keV and a dose of $4\times10^{15}$ at/$cm^2$. The n-doped implanted regions 123 are self-aligned with respect to the $n^+$-doped gate electrodes 116 and the insulation structures 16 (see FIG. 12). The metallization plane 117 arranged above the $n^+$-doped gate electrode 116 masks the $n^+$-doped gate electrode 116 during the implantation.

Figure 13:
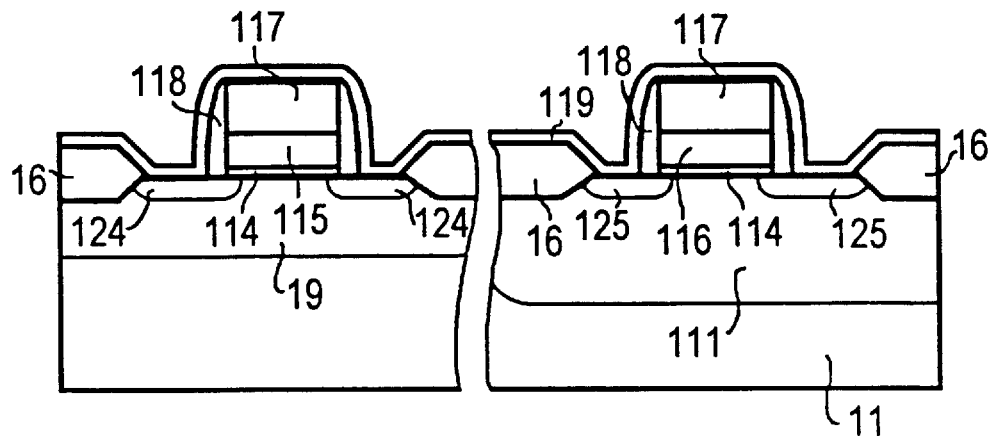
FIG. 13 shows the section, shown in FIG. 12, through the substrate after a heat-treatment for activating the dopants of the source/drain regions.
Figure 14:
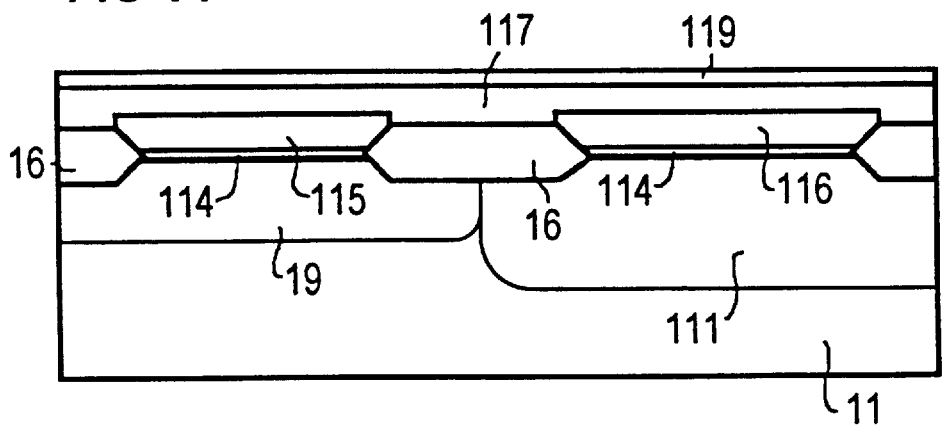
FIG. 14 shows the section, denoted XIV—XIV in FIG. 8, through the substrate.

After the fifth mask 122 has been removed, a heat-treatment step at, for example, 900° C. is carried out to activate the dopants, during which p-doped source/drain regions 124 are formed from the p-doped implanted regions 121, and n-doped source/drain regions 125 are formed from the n-doped implanted regions 123 (see FIG. 13). FIG. 14 represents the section, denoted IV—IV in FIG. 8, through the structure. Between opposite insulation structures 16, the gate electrodes 115, 116 extend perpendicularly to the channel length. Differently doped gate electrodes 115, 116 are connected to one another via the metallization plane 117 over the insulation structure 16.

The CMOS circuit 16 is completed in known fashion by BPSG deposition, planarization, contact-hole etching and metallization.

Figure 15:
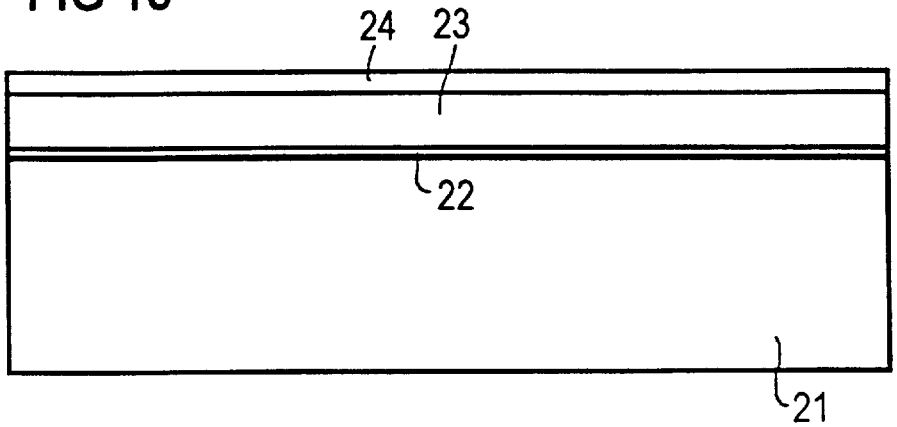
FIG. 15 shows a section through a substrate with a dielectric layer, a silicon layer and a cover layer.

In another illustrative embodiment, a dielectric layer 22, a silicon layer 23 and a cover layer 24 are applied to a monocrystalline silicon substrate 21. Later in the process a gate dielectric is formed from the dielectric layer 22. The dielectric layer 22 is, for example, produced from $SiO_2$, by thermal oxidation, with a layer thickness of 3 to 20 nm. The silicon layer 23 is deposited using polycrystalline or amorphous silicon to a thickness of 50 to 400 nm. The cover layer 24 is, for example, formed by CVD of $Si_3N_4$ with a layer thickness of 50 to 300 nm (see FIG. 15).

Figure 16:
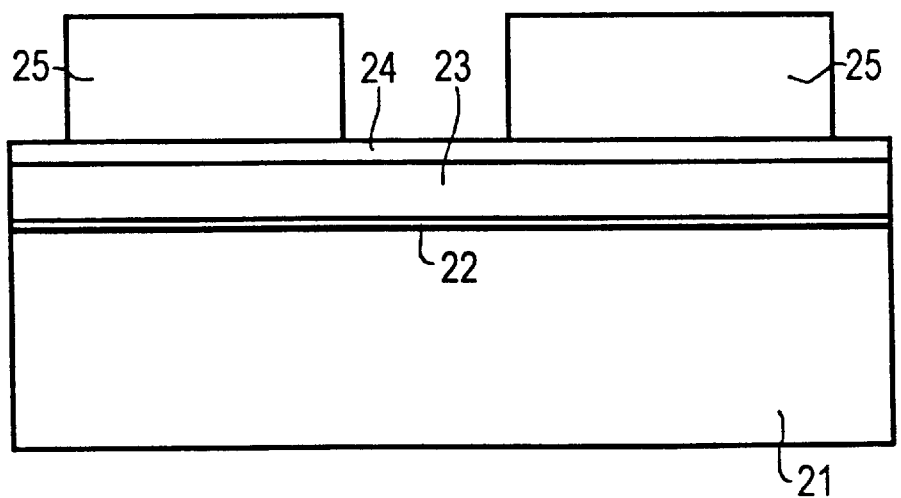
FIG. 16 shows the section through the substrate after formation of an insulation mask.

An insulation mask 25, which defines the arrangement of insulation structures to be produced later, is produced using photolithographic process steps (see FIG. 16).

Using an anisotropic multi-stage dry etching process, the cover layer 24, the silicon layer 23 and the dielectric layer 22 are structured in accordance with the insulation mask 25 and trenches are etched into the substrate 21. After the insulation mask 25 has been removed, the trenches are filled with insulating material, for example $SiO_2$, and planarized by means for chemical mechanical polishing. This forms insulation structures 26, which consist of the oxide-filled trenches (see FIG. 17). The insulation structures 26 are produced using the so-called shallow-trench insulation process. Since the dielectric layer 22, from which the gate dielectric is formed later in the process, is deposited before the trench etching and is structured together with the trench etching, the problem of oxide thinning, which occurs in the shallow-trench insulation process at the edge of the trenches when the gate dielectric is formed, does not arise in the process according to the invention.

The insulation structures 26 each annularly surround active regions 27 for p-channel MOS transistors and n-channel MOS transistors. Furthermore, the insulation structures 26 divide the silicon layer 23 into sub-regions which are each arranged above an active region 27 and are annularly enclosed by the insulation structures 26.

A first photoresist mask 28, which covers the active region for the n-channel MOS transistors, is produced using photolithographic process steps. Ion implantation is then carried out with phosphorous, at an energy of 500 keV and a dose of $1\times10^{13}$ at/$cm^2$. This forms an n-doped well 29 for the p-channel MOS transistors. Channel implantation with phosphorus at an energy of 220 keV and a dose of $3\times10^{12}$ at/$cm^2$ is then carried out (see FIG. 18). During these implantations, the energy is selected in such a way that the ions are propelled through the cover layer 24 and the silicon layer 23 and the dielectric layer 22, into the substrate 21.

The silicon layer 23 for p-channel MOS transistors is $p^+$-doped by implantation with boron at an energy of 20 keV and a dose of $5\times10^{15}$ at/$cm^2$. The energy for this implantation is selected in such a way that the dopants are propelled into the silicon layer 23.

Figure 19:
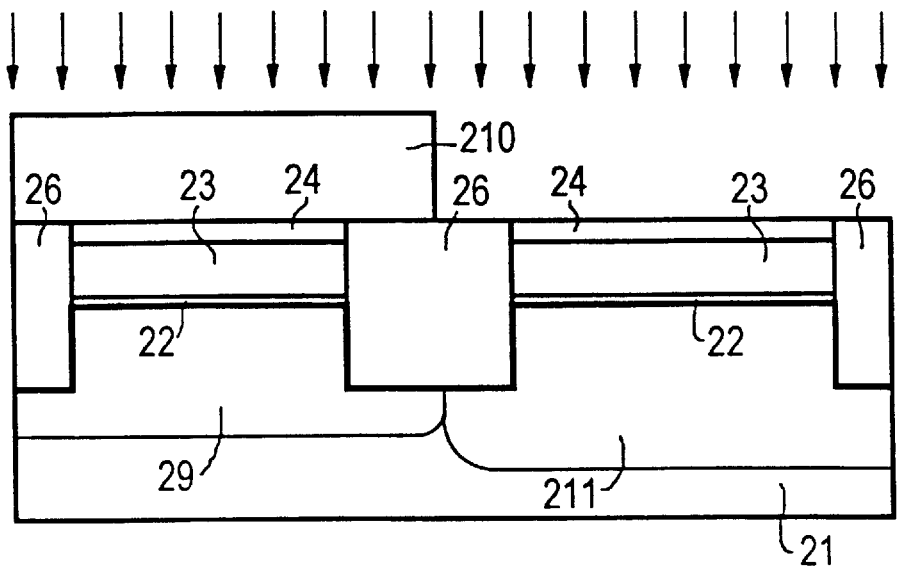
FIG. 19 shows the section through the substrate during the doping of the structured silicon layer in regions for second MOS transistors.

After the first mask 28 has been removed, a second mask 210, which covers the regions for p-channel MOS transistors, is formed using photolithographic process steps. A p-doped well 211 is formed by implantation with boron at an energy of 250 keV and a dose of $1\times10^{13}$ at/$cm^2$. Channel implantation for the n-channel MOS transistors is then carried out by implantation with boron at an energy of 100 keV and a dose of $3\times10^{12}$ at/$cm^2$ (see FIG. 19). During these implantations, the energy is selected in such a way that the dopants are propelled through the cover layer 24, the silicon layer 23 and the dielectric layer 22, into the substrate. Implantation with arsenic at an energy of 100 keV and a dose of $5\times10^{15}$ at/$cm^2$ is then carried out in order to $n^+$-dope the silicon layer 23 in regions for n-channel MOS transistors. During this implantation, the energy is set in such a way that the dopants are propelled into the silicon layer 23.

After the second mask 210 has been removed, a heat-treatment step is carried out at 900° C. to activate the implanted dopants. During this heat-treatment step, defects in the dielectric layer 22, which are created during the high-energy ion implantation for forming the wells and the channel implantations, are also healed.

The cover layer 24 is then removed, for example by a wet chemical process.

Figure 20:
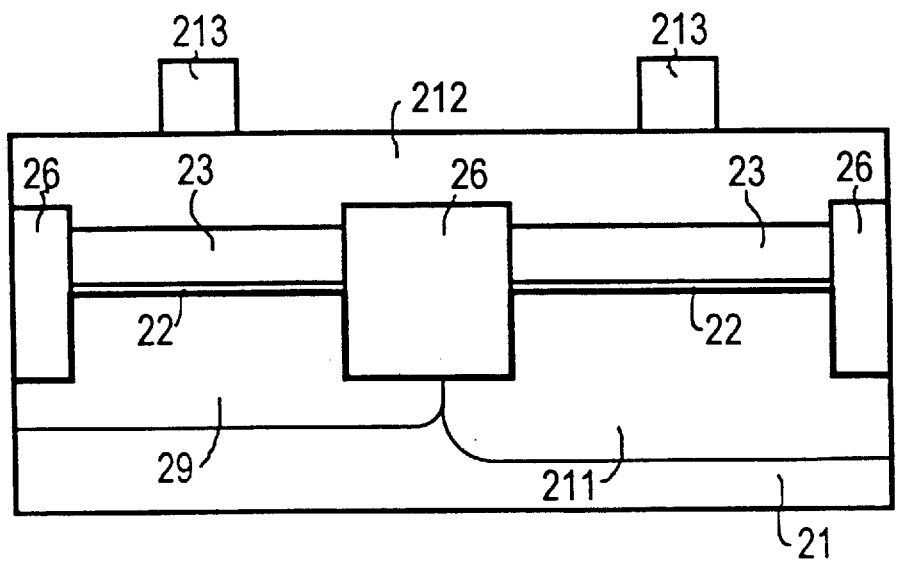
FIG. 20 shows the section through the substrate after deposition of an electrically conductive layer and formation of a mask for the gate structuring.

An electrically conductive layer 212 is deposited over the entire surface. The electrically conductive layer 212 is, for example, formed from tungsten with a layer thickness of, for example, 200 nm. The electrically conductive layer 212 may also be formed from a different metal, a metal silicide, TiN or a layer combination of metal and silicon, titanium nitride and silicon or a thin dielectric and silicon. A third mask 213, which defines the shape and arrangement of gate electrodes formed by structuring from the silicon layer 23, and a metallization plane formed by structuring the electrically conductive layer 212, is formed on the surface of the electrically conductive layer 212 (see FIG. 20).

The third mask 213 is formed from photoresist using photolithographic process steps.

The electrically conductive layer 212, the silicon layer 23 and the dielectric 22 are structured by anisotropic dry etching. This produces a gate dielectric 214 from the dielectric layer 22, a p$^+$-doped gate electrode 215 from the silicon layer 23 in regions for p-channel MOS transistors, and an n$^+$ doped gate electrode 216 from the silicon layer 23 in regions for n-channel MOS transistors, and a metallization plane 217 from the electrically conductive layer 212 (see FIG. 21 and FIG. 22). The metallization plane 217 covers the gate electrodes 215, 216 and electrically connects to one another differently doped gate electrodes 215, 216 which are separated from one another by the insulation structures 26. The metallization plane 217 extends over the gate electrodes 215, 216 and runs partly along the surface of the insulation structures 26. By means of the metallization plane 217, an electrically conductive connection is produced between differently doped gate electrodes 215, 216, without the occurrence of lateral dopant diffusion between p$^+$-doped gate electrodes 215 and n$^+$-doped gate electrodes 216.

Between the insulation structures 26 and the gate electrodes 215, 216, the surface of the substrate 21 is exposed in each of the active regions 27. Insulating spacers 218 are formed on the flanks of the gate electrodes 215, 216 and the metallization plane 217 by conformally depositing an insulating layer and anisotropically etching back the insulating layer. The insulating spacers 218 are, for example, formed from SiO$_2$, Si$_3$N$_4$, SiO$_2$ and polysilicon or Si$_3$N$_4$ and polysilicon. An insulating layer 219 of Si$_3$N$_4$ or SiO$_2$ is then deposited over the entire surface. The insulating layer 219 is produced with a layer thickness of 10 to 20 nm and acts as a screen oxide in the subsequent source/drain implantation, and as an etch barrier during the subsequent planarization by chemical mechanical polishing (see FIG. 23).

Figure 24:
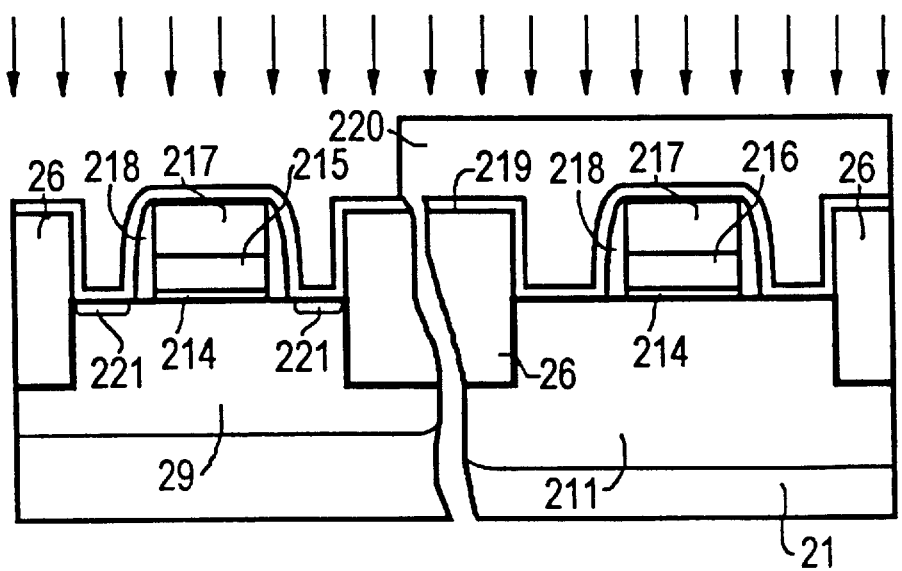
FIG. 24 shows the section, represented in FIG. 23, through the substrate during the source/drain implantation for the first MOS transistors.

A fourth photoresist mask 220, which covers the regions for n-channel MOS transistors, is formed using photolithographic process steps. Implantation with boron is carried out at an energy of 10 keV and a dose of 4×10$^{15}$ at/cm$^2$, during which p-doped implanted regions 221 are formed self-aligned with respect to the p$^+$-doped gate electrodes 215 which are provided with insulating spacers 218, and with respect to the surrounding insulation structures 26 (see FIG. 24). During the implantation, the metallization plane 217 covers the p$^+$-doped gate electrode 215.

Figure 25:
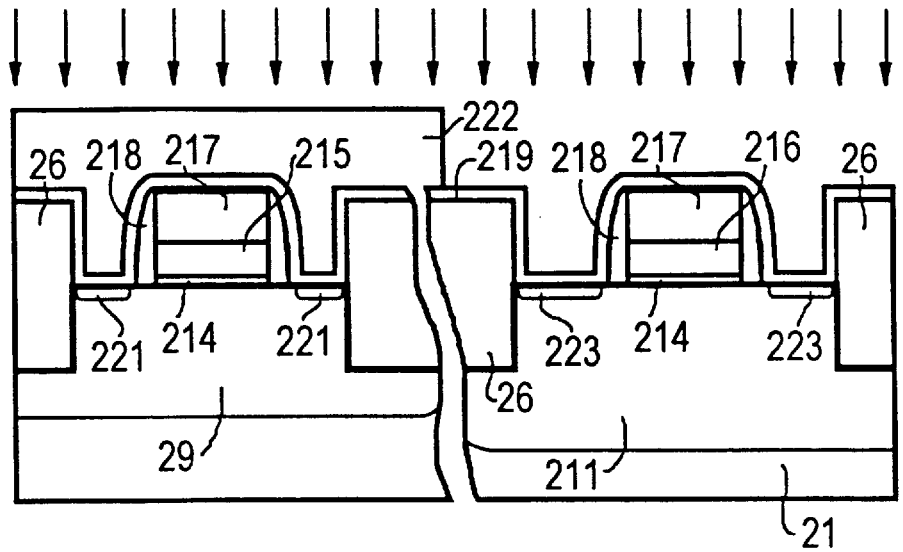
FIG. 25 shows the section, represented in FIG. 24, through the substrate during the source/drain implantation for the second MOS transistors.

After the fourth mask 220 has been removed, a fifth photoresist mask 222 is formed using photolithographic process steps (see FIG. 25). The fifth mask 222 covers the regions for p-channel MOS transistors. Implantation with arsenic is carried out, at an energy of 60 keV and a dose of 4×10$^{15}$ at/cm$^2$, during which n-doped implanted regions 223 are formed, self-aligned with respect to the n$^+$-doped gate electrodes 216 which are provided with the insulating spacers 218, and with respect to the surrounding insulation structures 26 (see FIG. 25). The n$^+$-doped gate electrode 216 is covered by the metallization plane 217 during the implantation.

After the fifth mask 222 has been removed, a heat-treatment step is carried out at, for example, 900° C., in order to activate the implanted dopants. This forms p$^+$-doped source/drain regions 224 for the p-channel MOS transistors and N$^+$-doped source/drain regions 225 for the n-channel MOS transistors.

Figure 26:
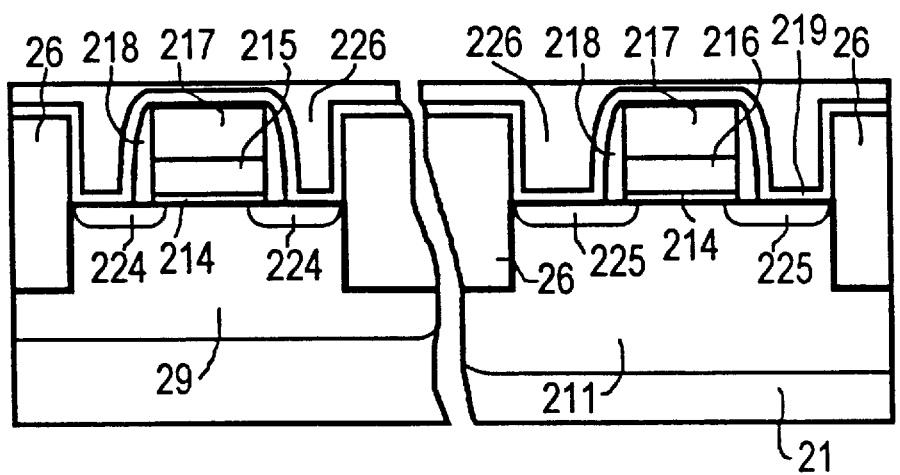
FIG. 26 shows the section, represented in FIG. 25, through the substrate after a heat-treatment step for activating the source/drain regions.

An intermediate oxide 226 is then deposited and planarized by chemical mechanical polishing. During this, this insulating layer 219 above the metallization plane 217 acts as an etch barrier layer (see FIG. 26).

Figure 27:
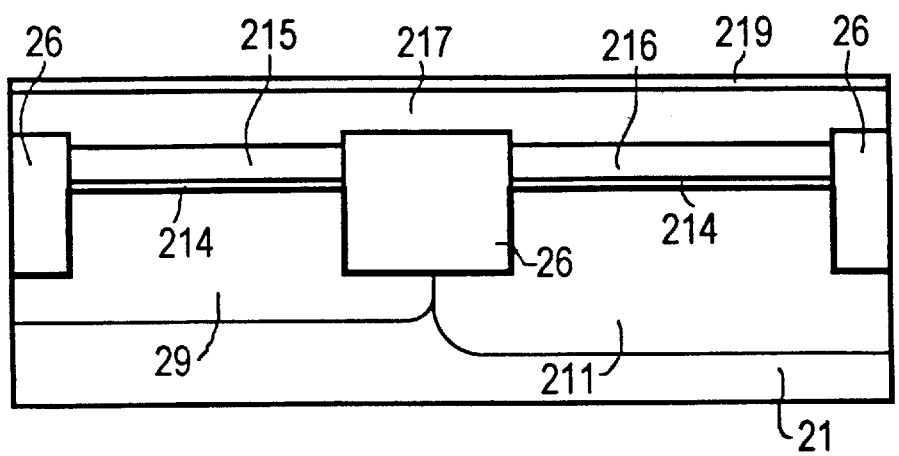
FIG. 27 shows the section, denoted XXVII—XXVII in FIG. 21, through the substrate.

FIG. 27 represents the section denoted XXVII—XXVII in FIG. 21. Between opposite insulation structures 26, the gate electrodes 215, 216 extend perpendicularly to the channel length. The gate electrodes 215, 216 of neighboring MOS transistors are in this case separated by the insulation structure 26. Gate electrodes 215, 216 of neighboring MOS transistors are electrically connected via the metallization plane 217. Lateral dopant diffusion between differently doped gate electrodes 215, 216 does not occur, since they are separated by the insulation structurers 26.

The CMOS circuit is then conventionally finished by contact-hole etching, metallization, passivation etc. in known fashion (not represented).

Figure 23:
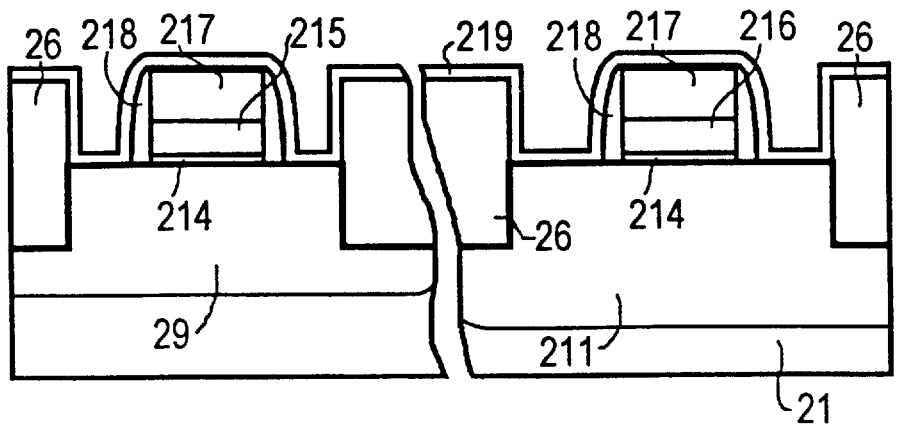
FIG. 23 shows the section, shown in FIG. 22, through the substrate after formation of spacers on the flanks of the gate electrodes.

In this illustrative embodiment, silicon may be grown by selective epitaxy on the surface of the substrate 21 which is exposed in the active regions 27 before the insulating layer 219 is deposited (see FIG. 23). The structure is thereby planarized, so that planarization of the intermediate oxide 226 is simplified. Furthermore, source/drain regions 224, 225 which are flatter can be produced by this measure with respect to the position of the gate dielectric 214. The implanted regions 221, 223 are formed in the grown silicon. During the heat-treatment step for activating the dopants, the source/drain regions 224, 225 are then created by diffusion out of the grown silicon into the substrate 21.

In both illustrative embodiments, the dielectric layer 12, 22 can alternatively be formed from nitridated oxide. Nitridated oxide is formed by oxidation at 1100° C. for 5 to 60 seconds in an O$_2$ atmosphere, nitridation at 900 to 1100° C. by using NH$_3$ and/or N$_2$O, and subsequent reoxidation at 1150° C. Nitridated oxide acts as a dopant barrier. This ensures that, during the implantation of the silicon layer 13, 23, no dopant can enter the channel region of the MOS transistor to be produced later. This problem is particularly critical during the boron doping. If the insulation structures are formed by a LOCOS process, the dielectric layer is produced from nitridated oxide with a thickness such that the equivalent nitride thickness is less than 4 nm. It has been established that nitride in this thickness range does not act as an oxidation barrier.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process for producing of an integrated CMOS circuit, comprising the steps of:

depositing a dielectric layer and a silicon layer on a substrate which has monocrystalline silicon that forms at least one main face of the substrate;

forming insulation structures in the silicon layer, which insulate neighboring transistors in the substrate, on the main face of the substrate such that the silicon layer has a plurality of sub-regions which are each separated from one another by the insulation structures;

doping regions of, for a later formed first MOS transistors with a channel of a first conductivity type, the silicon layer differently than doping regions of the silicon layer for a later formed second MOS transistors with a channel of a second conductivity type, opposite to the first conductivity type;

depositing an electrically conductive layer over the insulation structures and the sub-regions of the silicon layer;

forming a common mask above the electrically conductive layer; structuring via the common mask the electrically conductive layer and the silicon layer to form gate electrodes; and at a side of a gate electrode, forming source/drain regions for the first MOS transistors and for the second MOS transistors.

2. The process according to claim 1, wherein the silicon layer is doped in regions in which the first MOS transistors are formed, while the silicon layer is covered with a first mask in regions in which the second MOS transistors are formed, and wherein the silicon layer is doped in regions for the second MOS transistors while the silicon layer is covered with a second mask in regions for the first MOS transistors.

3. The process according to claim 1, wherein the silicon layer is doped in regions for the first MOS transistors with the first conductivity type, and in regions for the second MOS transistors with the second conductivity type.

4. The process according claim 1, wherein by using the first mask, implantation for forming wells doped with the second conductivity type, and channel implantation for the first MOS transistors, take place before the silicon layer is doped in regions for the first MOS transistors;

and wherein by using the second mask the implantation for forming wells doped with the first conductivity type, and channel implantation for the second MOS transistors, take place before the silicon layer is doped in regions for the second MOS transistors.

5. The process according to claim 1, wherein a cover layer is applied onto the silicon layer and is structured before the insulation structures are produced with a side of an insulation mask defining an arrangement of the insulation structures;

and wherein the cover layer is removed before the electrically conductive layer is deposited.

6. The process according to claim 1, wherein a cover layer is applied onto the silicon layer and is structured before the insulation structures are produced using an insulation mask defining an arrangement of the insulation structures, and wherein the cover layer is removed before the electrically conductive layer is deposited.

7. The process according to claim 6, wherein the cover layer is formed by a non-oxidizable material;

and wherein the insulation structures are formed by a local thermal oxidation, in which the structured cover layer acts as an oxidation mask.

8. The process according to claim 6, wherein trenches, which are filled with insulating material, are formed by etching the substrate to form the insulation structures by using the structured cover layer as an etching mask.

9. The process according to claim 6, wherein the silicon layer is formed by polycrystalline silicon, wherein the conductive layer contains at least one of a high-melting metal, a metal silicide and TiN;

wherein the dielectric layer contains at least one of $SiO_2$ and $Si_3N_4$, wherein the cover layer contains $Si_3N_4$, and wherein the silicon layer is doped by implantation.

10. The process according to claim 1, wherein insulating flank coverings are produced on flanks of gate electrodes of the first and second MOS transistors;

wherein ion implantation is carried out to form source/drain regions for the first MOS transistors, during which source/drain regions for the second MOS transistors are covered with a fourth mask;

and in which ion implantation is carried out to form the source/drain regions for the second MOS transistors, during which the source/drain regions for the first MOS transistors are covered with a fifth mask.

11. A process for producing of an integrated CMOS circuit, comprising the steps of:

depositing a dielectric layer and a silicon layer on a substrate which has monocrystalline silicon that forms at least one main face of the substrate;

forming insulation structures in the silicon layer, which insulate neighboring transistors in the substrate, at the main face of the substrate such that the silicon layer has a plurality of sub-regions which are each separated from one another the insulation structures;

doping the silicon layer in first regions in which first MOS transistors are formed, while the silicon layer is covered with a first mask in regions in which second MOS transistors are formed, and doping the silicon layer in second regions for the second MOS transistors while the silicon layer is covered with a second mask in regions for the first MOS transistors, the first MOS transistors having a channel of a first conductivity type and the second MOS transistors having a channel of a second conductivity type, opposite to the first conductivity type, the doping in the first regions thereby being different from the doping in the second regions;

forming source/drain regions for the first MOS transistors and for the second MOS transistors.

12. The process according to claim 11, wherein the structured silicon layer is doped in regions for the first MOS transistors with the first conductivity type, and in regions for the second MOS transistors with the second conductivity type.

13. The process according claim 11, wherein by using the first mask, implantation for forming wells doped with the second conductivity type, and channel implantation for the first MOS transistors, take place before the structured silicon layer is doped in regions for the first MOS transistors;

and wherein by using the second mask the implantation for forming wells doped with the first conductivity type, and channel implantation for the second MOS transistors, take place before the structured silicon layer is doped in regions for the second MOS transistors.

14. The process according to claim 11, wherein a cover layer is applied onto the silicon layer and is structured before the insulation structures are produced with a side of an insulation mask defining an arrangement of the insulation structures;

and wherein the cover layer is removed before the electrically conductive layer is deposited.

15. The process according to claim 11, wherein a cover layer is applied onto the silicon layer and is structured before the insulation structures are produced using an insulation mask defining an arrangement of the insulation structures;

and wherein the cover layer is removed before the electrically conductive layer is deposited.

16. The process according to claim 15, wherein the cover layer is formed by a non-oxidizable material;

and wherein the insulation structures are formed by a local thermal oxidation, in which the structured cover layer acts as an oxidation mask.

17. The process according to claim 15, wherein trenches, which are filled with insulating material, are formed by etching the substrate to form the insulating structures by using the structured cover layer as an etching mask.

18. The process according to claim 15, wherein the silicon layer is formed by polycrystalline silicon;

wherein the conductive layer contains at least one of a high-melting metal, a metal silicide and TiN;

wherein the dielectric layer contains at least one of $SiO_2$ and $Si_3N_4$;

wherein the cover layer contains $Si_3N_4$;

and wherein the structured silicon layer is doped by implantation.

19. A process for producing of an integrated CMOS circuit, comprising the steps of:

depositing a dielectric layer and a silicon layer on a substrate which has monocrystalline silicon that forms at least one main face of the substrate;

depositing a cover layer of a non-oxidizable material onto the silicon layer and structuring the cover layer using an insulation mask that defines an arrangement of insulation structures;

forming the insulation structures in the silicon layer by local thermal oxidation, which insulate neighboring transistors in the substrate, at the main face of the substrate, the cover layer functioning as an oxidation mask, such that the silicon layer has a plurality of sub-regions which are each separated from one another by the insulation structures;

doping, in regions of the silicon layer for first MOS transistors with a channel of a first conductivity type, the silicon layer differently than in regions of the silicon layer for second MOS transistors with a channel of a second conductivity type that is opposite to the first conductivity type;

removing the cover layer;

depositing an electrically conductive layer over the insulation structures and the sub-regions of the silicon layer;

structuring via a common mask the electrically conductive layer and the structured silicon layer to form gate electrodes; and forming source/drain regions for the first MOS transistors and for the second MOS transistors.

20. The process according to claim 19, wherein the silicon layer is formed by polycrystalline silicon;

wherein the conductive layer contains at least one of a high-melting metal, a metal silicide and TiN;

wherein the dielectric layer contains at least one of $SiO_2$ and $Si_3N_4$;

wherein the cover layer contains $Si_3N_4$;

and wherein the structured silicon layer is doped by implantation.

* * * * *